United States Patent [19]

Wang et al.

[11] 4,315,477
[45] Feb. 16, 1982

[54] SEMI-OPEN LIQUID PHASE EPITAXIAL GROWTH SYSTEM

[75] Inventors: Cheng-Chi Wang, Thousand Oaks; August H. B. Vanderwyck, Newbury Park, both of Calif.

[73] Assignee: Rockwell International Corporation, El Segundo, Calif.

[21] Appl. No.: 214,548

[22] Filed: Dec. 9, 1980

Related U.S. Application Data

[62] Division of Ser. No. 132,756, Mar. 24, 1980, Pat. No. 4,263,065.

[51] Int. Cl.$^3$ ............................................. H01L 7/00
[52] U.S. Cl. ..................................... 118/64; 118/66; 118/69; 118/424; 118/428; 118/429; 148/171; 148/172
[58] Field of Search ................. 148/171, 172; 118/726, 118/724, 64, 66, 69, 424, 428, 429; 156/621, 623 R, 623 Q, 624

[56] References Cited

U.S. PATENT DOCUMENTS

| | | | |
|---|---|---|---|
| 3,113,056 | 6/1976 | Van Doorn | 148/171 |
| 3,585,087 | 4/1977 | Blum et al. | 148/171 |
| 3,718,511 | 5/1977 | Moulin | 148/171 |
| 3,902,924 | 8/1977 | Maciolek et al. | 148/172 |

OTHER PUBLICATIONS

Gertner, et al., Liquid Phase Epitaxial Growth of InAs$_x$Sb$_y$P$_{1-x-y}$ Layers on InAs, 6 J. Elect. Mat. 163 (1977).
Kanamori, et al., Liquid Phase Epitaxial Growth of ZnTe and Zn$_{1-x}$Cd$_x$Te, 122 J. Electrochem. Soc. 1117 (1975).
Lanir, et al., Backside-Illuminated HgCdTe/CdTe Photodiodes, 34 Appl. Phys. Lett. 50 (1979).
Longo, et al., Low-Carrier-Concentration Liquid Epitaxial Pb$_{1-x}$Sn$_x$Te, 19 Appl. Phys. Lett. 202 (1971).
Longo, et al., Improved Surface Quality of Solution Grown GaAs and Pb$_{1-x}$Sn$_x$Te Epitaxial Layers: A New Technique, 15 J. Crystal Growth 107 (1972).
Longo, et al., Material Properties of Solution-Grown Pb$_{1-x}$Sn$_x$Te, 1 J. Nonmetals, 321 (1973).
Rode, et al., Liquid Phase Epitaxial Growth of Ga$_{1-x}$In$_x$Sb on GaSb by Step-wise Grading, 7 J. Elect. Mat. 337 (1978).
Simashkevich, et al., Liquid-Phase Epitaxy of CdSe, ZnSe, and ZnTe Layers, 35 J. Crystal Growth 269 (1976).
Steininger, High Pressure Reflux Technique for Growth of Hg$_{1-x}$Cd$_x$Te Crystals, 37 J. Crystal Growth 107 (1977).
Vohl, et al., Vapor Phase Growth of Hg$_{1-x}$Cd$_x$Te Epitaxial Layers, 7 J. Elect. Mat. 659 (1978).
Widmer, et al., Liquid Phase Epitaxy on Zinc Telluride, 6 J. Crystal Growth 237 (1970).

*Primary Examiner*—Ralph S. Kendall
*Attorney, Agent, or Firm*—H. Fredrick Hamann; Craig O. Malin; John J. Deinken

[57] ABSTRACT

Disclosed is a semi-open method of growing an epitaxial HgCdTe layer on a CdTe substrate, including the steps of placing the CdTe substrate and a growth solution of Hg, Cd, and Te within a pressure and temperature controlled container, flowing an inert gas under pressure through the container to reduce the vaporization of Hg from the solution, establishing a cooling zone within the container to condense Hg vaporized from the solution, increasing the temperature of the solution for a time sufficient to react the Hg and Cd with the Te in the solution, reducing the temperature of the solution, establishing contact between the solution and the substrate, maintaining the solution at a temperature sufficient to melt the substrate for a time sufficient to eliminate a Hg vapor diffused layer, reducing the temperature of the solution to near the saturation temperature, and reducing the temperature of the solution at a rate sufficient to cause the solution to crystallize in an HgCdTe layer on the CdTe substrate.

5 Claims, 3 Drawing Figures

SEMI-OPEN LIQUID PHASE EPITAXIAL GROWTH SYSTEM

GOVERNMENT RIGHTS

The Government has rights in this invention pursuant to Contract No. DASG60-77-C-0043 awarded by the United States Army.

This is a division of application of Ser. No. 132,756, filed Mar. 24, 1980, now U.S. Pat. No. 4,263,065.

BACKGROUND OF THE INVENTION

This invention relates to semiconductor fabrication technology and, more particularly, to liquid phase epitaxial growth techniques.

One important application of silicon charge transfer devices is as imagers in the visible region of the spectrum. II-VI compound semiconductors can be used in a similar manner to extend the imaging capability to the infrared region, thereby rendering the latter devices particularly important for national defense applications requiring the detection of infrared radiation. The $Hg_{1-x}Cd_xTe$ alloy, for example, is an intrinsic II-VI compound semiconductor whose alloy content can be adjusted to cover any part of the spectral range from 0.8 to over 30 $\mu$m. HgCdTe can be utilized in an imaging function in a hybrid focal plane, wherein an HgCdTe detector is mated to a silicon signal multiplexer. An even more desirable imaging arrangement is realized in a monolithic focal plane, which is formed from a single semiconductor. In this design, the semiconductor includes an HgCdTe sensor layer for photon detection, while a CdTe layer is provided for signal processing functions. The CdTe layer exhibits a wide bandgap, so that the dark current therein is inherently low. Furthermore, this semiconductor is intrinsic by nature, and thereby operates at a higher temperature than extrinsic silicon, permitting the realization of a heterojunction structure in the detector. In this manner, the monolithic focal plane technique makes possible the detection of low infrared energy in a narrow gap semiconductor and the transfer of the resulting charges to a wider gap semiconductor for signal processing.

Although II-VI semiconductor compounds are required for these applications, attempts at producing high quality II-VI compounds have met with only limited success in the prior art. Production has been restricted for the most part to the bulk type of crystals, which are obtained by solidification from a melt. Unfortunately, however, bulk crystals, when used in an imaging application, are restricted to frontside illuminated modes, unless the crystals are backside thinned. In addition to this deficiency, there is a need for a production technique which will yield large area, uniform $Hg_{1-x}Cd_xTe$ layers. Such a material would exhibit a greater efficiency and a higher operating temperature than the materials which previously have been obtainable.

One way in which these needs could be met is with an epitaxially grown material. An epitaxial imager, for example, is capable of operating in a backside illuminated mode without substrate thinning. This feature would render the epitaxially grown devices more compatible with the hybrid focal plane configuration. Furthermore, the lower growth temperature which is inherent in liquid phase epitaxial techniques, as compared with bulk growth, would yield compounds of a more uniform composition. Finally, a relatively thin epitaxial layer, is such a layer could be grown, would limit the bulk generation volume of a diffusion current within the material. As a consequence, epitaxial diodes fabricated from such material would be expected to have a higher $R_oA$ product.

Although the liquid phase epitaxial growth method would thus provide a higher quality, more useful product, this technique has not been heretofore successfully applied to the growth of II-VI compounds. Liquid phase epitaxy, which is a relatively low temperature growth process developed extensively in connection with the preparation of high quality III-V and IV-VI semiconductors, could be used to solve two major problems encountered in II-VI compound bulk crystal growth, the compositional nonuniformity which is experienced and the long annealing times which are necessary to reach homogeneity in the bulk materials. Only limited attempts have been made, however, to apply liquid phase epitaxial techniques to the growth of II-VI compounds. The high vapor pressures characteristic of Column II elements make it difficult to maintain the proper concentration of the Column II elements within the growth solution during growth. In addition, liquid phase epitaxial techniques are further limited by the low solubility of Column VI elements in Column II elements at the relatively low temperatures used in the epitaxial growth techniques.

Therefore, a need has developed in the art for a liquid phase epitaxial growth system which may be utilized to grow high quality II-VI compound semiconductors.

SUMMARY OF THE INVENTION

It is a general object of this invention to provide a new and improved liquid phase epitaxial growth technique.

A semi-open method for growing an epitaxial layer on a substrate begins, according to the present invention, with the step of placing a growth solution and the substrate within a pressure and temperature controlled container. The pressure within the container is then increased to reduce the vaporization of components dissolved in the solution, while a cooling zone is established within the container to condense components vaporized from the solution. The temperature of the solution is increased sufficiently to maintain the saturation of the solution, the solution is contacted by the substrate, and the temperature of the solution is reduced at a predetermined rate, causing the dissolved components in the solution to crystallize in an epitaxial layer on the substrate.

In a more particular embodiment, the method of this invention is directed toward growing an epitaxial layer of HgCdTe on a CdTe substrate. In this embodiment, the CdTe substrate and a growth solution of Hg, Cd, and Te are placed within a pressure and temperature controlled container. An inert gas at approximately 200 psi is applied to the container to reduce the vaporization of Hg from the solution and a cooling zone is established within the container to condense that Hg which is vaporized from the solution. The Hg and Cd is reacted with the Te in the solution by maintaining the solution at approximately 700° C. for approximately 1 hour. The temperature of the solution is then reduced to approximately 550° C., and contact is established between the solution and the substrate. The solution temperature is maintained at approximately 550° C. for approximately 15 seconds to melt back the substrate and eliminate any Hg vapor diffused layer. The temperature is then reduced to the saturation temperature of approximately 500° C. and the temperature of the solution is further reduced at a rate of approximately 0.25° C./min to cause the solution to crystallize in an HgCdTe layer on the CdTe substrate. In a more particular embodiment, the solution is caused to crystallize on a (111)Cd surface of the CdTe substrate.

An apparatus for growing an epitaxial layer on a substrate, as provided by this invention, includes a sealable container for receiving the substrate and a growth solution. A controllable source of heat is provided for adjusting the temperature of the growth solution and a controllable source of pressure communicates with the container to reduce the vaporization of components dissolved in the solution. A cooling zone within the container is arranged to condense components vaporized from the solution, while a movable fixture is arranged to support the substrate and contact the growth solution with the substrate.

These examples, including some of the more important features of the invention, have been broadly outlined in order to facilitate an understanding of the detailed description which follows and so that the contributions which this invention provides to the art may be better appreciated. There are, of course, additional features of the invention which will be further described below and which are included within the subject matter of the appended claims.

BRIEF DESCRIPTION OF THE DRAWINGS

Additional objects, features, and advantages of the present invention will become apparent by referring to the detailed description of the preferred embodiments in connection with the accompanying drawings, wherein the same reference numerals refer to like elements throughout all the figures. In the drawings.

DESCRIPTION OF THE PREFERRED EMBODIMENT

Although liquid phase epitaxial (LPE) growth techniques have been successfully utilized to grow many semiconductor compounds, the problems of high vapor pressure and low solubility have in the past limited the applicability of LPE techniques to some combinations, such as the II-VI compounds. It is an outstanding feature of the present invention to apply pressurized growth techniques, which have been previously utilized to grow bulk materials, to achieve a practical liquid phase epitaxial growth system for II-VI compounds.

Figure 1:
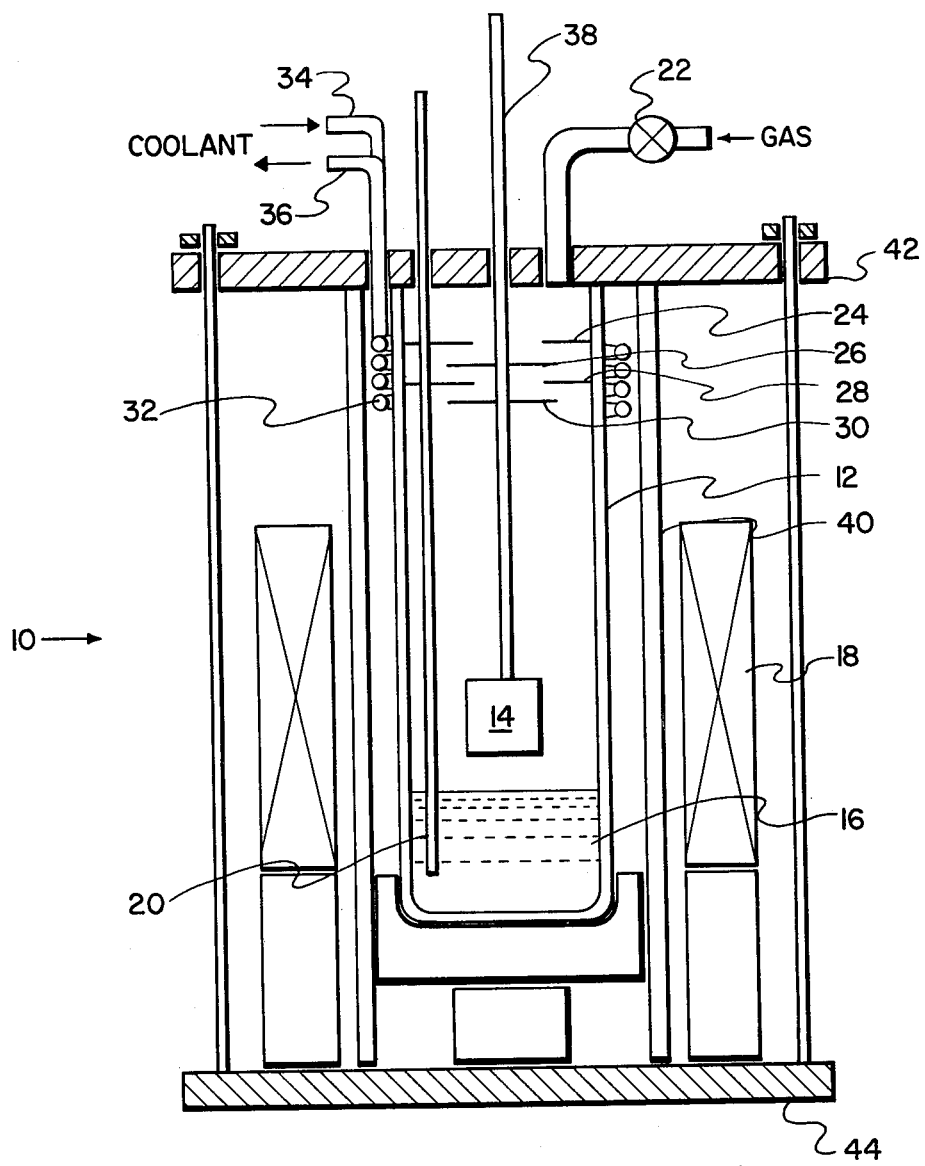
FIG. 1 is a cross-sectional side view of a semi-open liquid phase epitaxial growth apparatus constructed according to the present invention.

Illustrated in cross section in FIG. 1 is a vertical growth apparatus 10 constructed in accordance with the present invention. The apparatus 10 includes a sealable quartz growth container 12 for receiving a substrate 14 and a growth solution 16. A controllable source of heat is provided by a vertical resistance furnace 18, which may be used to adjust the temperature of the growth solution. A thermocouple 20 is positioned to monitor the temperature of the growth solution 16. A source of inert gas under pressure may be applied to the container 12 by means of a valve 22 in order to reduce the vaporization of components dissolved in a solution 16.

A cooling zone is established within the container through the cooperation of a series of baffles 24, 26, 28 and 30 within the container and a cooling conduit 32, which encircles the exterior of the container near the baffles. The conduit circulates a flow of cooling fluid through an inlet 34 and an outlet 36, thereby cooling the baffles and causing the components vaporized from the solution 16 to condense back into the solution. An alternative cooling zone has also been achieved by positioning a quantity of quartz wool in the container instead of the baffles 24–30. The substrate 14 is secured on a movable fixture 38, which may be lowered to dip the substrate into the growth solution. An outer quartz tube 40 surrounds the container 12, with the tube 40 and the container 12 being sealed between upper and lower flanges 42 and 44 to effect a pressurized environment within the container.

In order to practice the method of the present invention, the upper flange 42 is removed and an appropriate amount of a growth solution 16 having the proper composition is placed in the container 12. A substrate 14 of the desired material in then affixed to the movable fixture 38 and the container 12 is secured between the upper and lower flanges 42 and 44.

With the substrate and the growth solution thus enclosed, the pressure within the sealed container is increased by applying an inert gas to the container through the valve 22, while a chilled fluid, typically water, is circulated through the cooling conduit 32 to establish a cooling zone in the region of the baffles 24, 26, 28, and 30. The furnace 18 is utilized to increase the temperature of the growth solution, as indicated by the thermocouple 20, sufficiently to maintain the solution near saturation.

Once the solution has reached the proper saturation temperature, the fixture 38 is lowered to bring an appropriate growth surface of the substrate into contact with the solution. The solution temperature is then reduced at a predetermined rate to cause the dissolved components in the solution to crystallize in an epitaxial layer on the substrate. When a layer of the desired thickness has accumulated, the substrate is removed from the growth solution.

The epitaxial growth technique of this invention has been used to particular advantage in the preparation of mercury cadmium telluride ($Hg_{1-x}Cd_xTe$) alloy compositions. 20% HgCdTe epitaxial layers, for example, have been grown on CdTe substrates in the following manner: A CdTe substrate wafer is selected with a (111) Cd oriented surface for receiving the epitaxial growth. The substrate is lapped and chemically polished in a $Br_2$:HBr solution (10% $Br_2$ by volume), followed by an etch in a $Br_2$:$CH_3OH$ solution (5% $Br_2$ by volume). The substrate is then loaded into the growth container. High purity (99.9999%) Hg and Cd are reacted in a Te melt in the container for one hour at a temperature of approximately 700° C. In order to grow an $Hg_{0.8}Cd_{0.2}Te$ epilayer, the growth solution is adjusted to contain CdTe:Hg:Te in proportions by weight of 0.004:0.251:0.745. The pressure within the container is maintained at 200–300 psi by argon gas while the temperature is controlled to within ±0.05° C.

After the growth solution has been reacted sufficiently, the temperature is adjusted to 550° C. and the substrate is lowered into the growth solution. The substrate surface is allowed to melt back at this temperature for approximately 15 seconds, thereby eliminating any Hg vapor diffused layer established in the substrate during the heatup period.

The melt and the substrate are then reduced to the saturation temperature, at approximately 500° C., and the temperature is reduced at a controlled rate of approximately 0.25° C. per minute. The temperature reduction is continued for a sufficient time period to deposit an $Hg_{0.8}Cd_{0.2}Te$ epilayer of the desired thickness on the (111) Cd surface of the substrate. A 20 $\mu$m epilayer will be obtained after approximately one hour of growth time.

Figure 2:
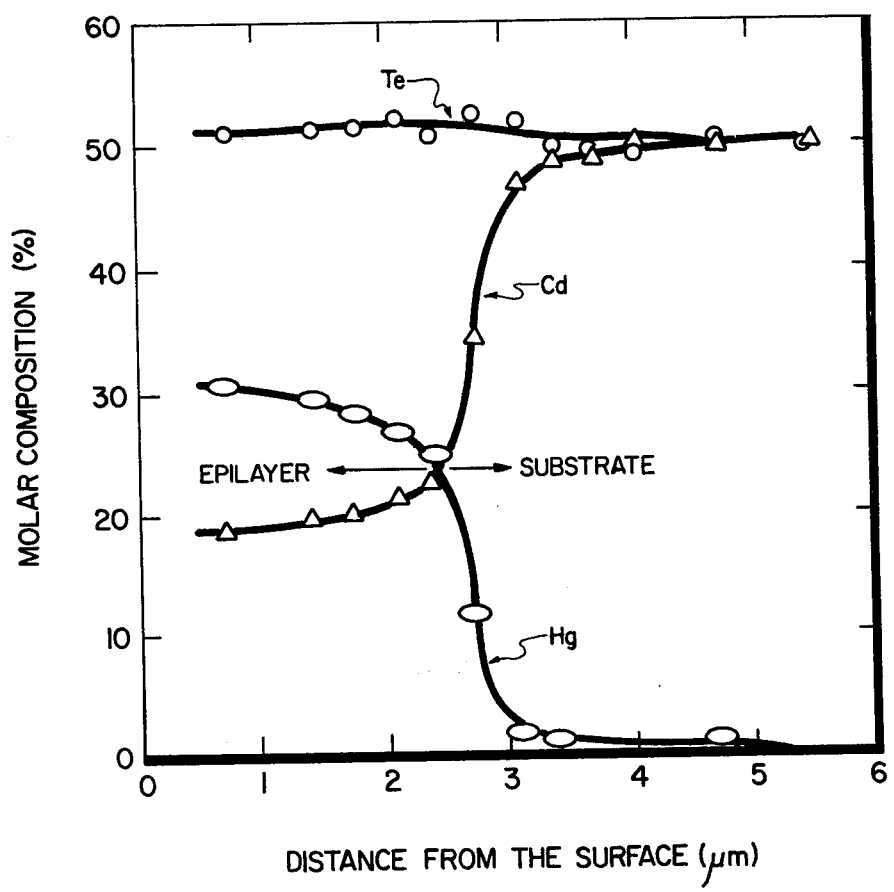
FIG. 2 is a plot of the layer composition of an epitaxial layer as a function of the distance from the surface of the layer, obtained by electron microprobe analysis on epitaxial layers grown by the method of the present invention.

An HgCdTe epilayer which is grown by the technique of our invention exhibits a number of advantageous properties. Such a layer possesses a surface of superior quality which is mirror like in smoothness and free from any residual melt. Experience indicates that an epilayer deposited on the (111) Cd surface has a better surface orthography than layers grown on the (111) Te, (110), and (100) surfaces. Electron microprobe analysis indicates that a major transition region exists between the HgCdTe epilayer and the substrate for approximately 2 $\mu$m for layers approximately 100 $\mu$m thick and less than 0.5 $\mu$m for thin layers of approximately 15 $\mu$m. The results of such an analysis for a typical HgCdTe layer with a Cd composition of 0.2 are plotted in FIG. 2, where the molar composition of the epilayer and the substrate are plotted as a function of the distance from the surface of the epitaxial layer. The major transition can be observed to be within an 0.5 $\mu$m region at the metallurgical interface. The gradual compositional change in the epilayer and the substrate, which is perhaps due to interdiffusion during the growth process, has been found to have no direct effect on the performance of devices based on these materials, since the ion implanted junctions for such devices are formed no deeper than a micron from the surface.

Figure 3:
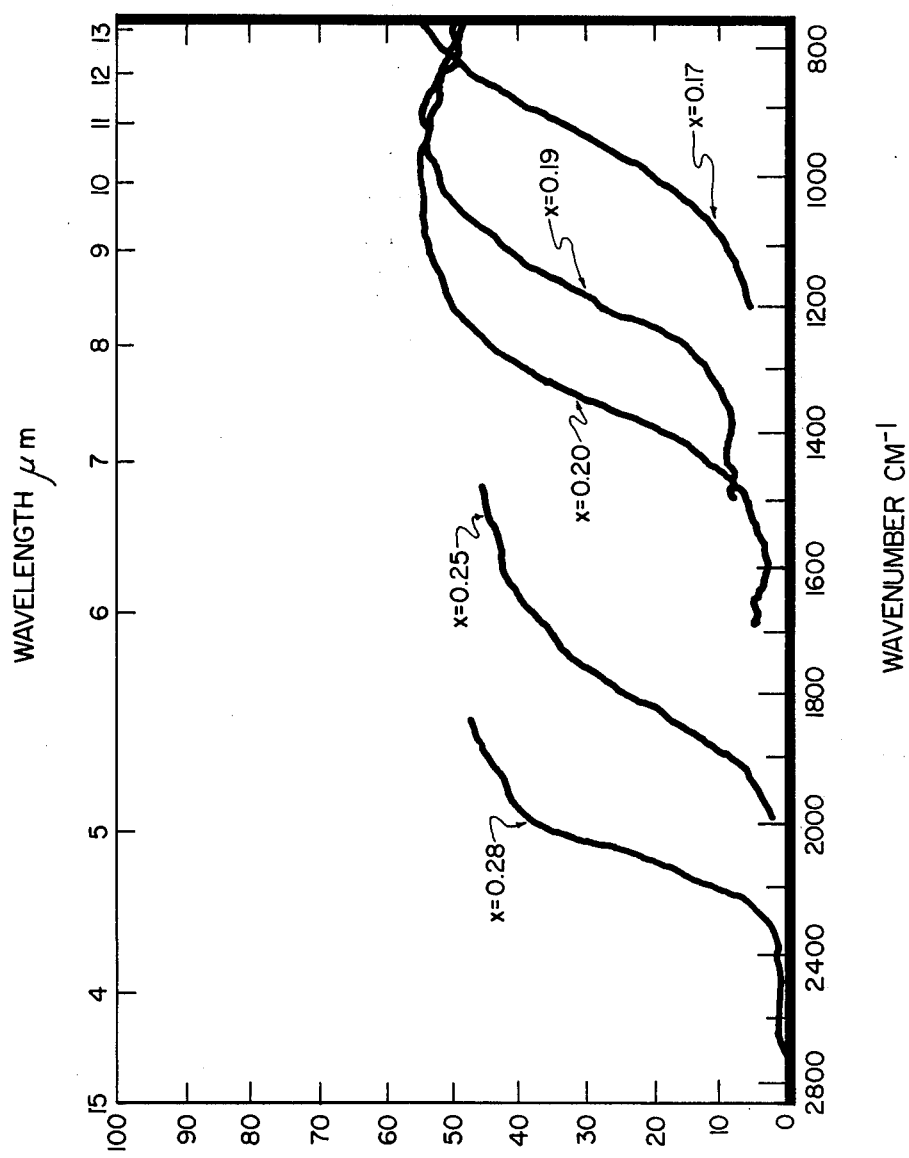
FIG. 3 is a plot of the infrared transmission spectrum, obtained for epitaxial layers grown by the method of the present invention, at a temperature of 300° K.

Another useful indication of the quality of the layer composition is provided by the infrared transmission of the device at 300° K. FIG. 3 illustrates such a transmission edge for 5 typical HgCdTe epilayers which were grown by the method of this invention with a Cd composition ranging from 0.17 to 0.28.

With regard to electrical characteristics, 20 $\mu$m thick $Hg_{0.8}Cd_{0.2}Te$ layers grown on CdTe have exhibited a p-type carrier concentration of $5 \times 10^{16}/cm^3$ and a hole mobility of 400 $cm^2/V$-s for an undoped substrate, and an n-type carrier concentration of $2 \times 10^{15}/cm^3$ with an electron mobility of $1 \times 10^5$ $cm^2/V$-s for a CdTe substrate doped with In. With these carrier concentrations, the devices may be fabricated to operate as high performance photovoltaic detectors. For these reasons those skilled in the art will appreciate that the growth technique of this invention presents a viable approach to preparing high quality II–VI epitaxial materials which may be incorporated into advanced device structures.

In conclusion, although typical embodiments of the present invention have been illustrated and discussed above, numerous modifications and alternative embodiments of the apparatus and method of this invention will be apparent to those skilled in the art in view of this description. Thus, for example, although the apparatus disclosed and discussed herein is a vertical phase epitaxial growth apparatus, those skilled in the art will appreciate that the advantages of this invention may also be realized in a horizontal growth apparatus, such as is typically used when multiple epitaxial layers are to be grown. Furthermore, although the discussion herein has focussed on the application of this invention to the growth of HgCdTe epitaxial layers, those skilled in the art will recognize that the invention may be applied with equal advantage to the epitaxial growth of other compounds as well. Accordingly, this description is to be considered as illustrative only and is provided for the purpose of teaching those skilled in the art the manner of constructing the apparatus and performing the method of this invention. Furthermore, it should be understood that the forms of the invention depicted and described herein are to be considered as the presently preferred embodiments. Various changes may be made in the configurations, sizes, and arrangements of the components of the invention, as will be recognized by those skilled in the art, without departing from the scope of the invention. Equivalent elements, for example, might be substituted for those illustrated and described herein, parts or connections might be reversed or otherwise interchanged, and certain features of the invention might be utilized independently of the use of other feeatues, all as will be apparent to one skilled in the art after receiving the benefit attained through reading the above description of the invention.

What is claimed is:

1. An apparatus for growing an epitaxial layer on a substrate, comprising:
   a sealable container for receiving said substrate and a growth solution;
   a controllable source of heat for adjusting the temperature of said growth solution;
   a controllable souce of pressure communicating with said container to reduce the vaporization of components dissolved in said solution;
   a cooling zone within said container for condensing components vaporized from said solution, said cooling zone including a quantity of quartz wool positioned in said container above said growth solution and a conduit positioned near to said quantity of quartz wool for receiving a cooling fluid; and
   a movable fixture for supporting said substrate and contacting said growth solution with said substrate.

2. An apparatus for growing an epitaxial layer on a substrate, comprising:
   a sealable container for receiving said substrate and a growth solution;
   a controllable source of heat for adjusting the temperature of said growth solution;
   a controllable source of pressure communicating with said container to reduce the vaporization of components dissolved in said solution;
   a cooling zone within said container for condensing components vaporized from said solution, said cooling zone including a series of baffles within said container above said growth solution and a conduit positioned near said series of baffles for receiving a cooling fluid; and
   a movable fixture for supporting said substrate and contacting said growth solution with said substrate.

3. The apparatus of claim 1 or 2, wherein said sealable container comprises a quartz container.

4. The apparatus of claim 3, wherein said source of heat further comprises a vertical furnace within which said quartz container is inserted.

5. The apparatus of claim 4, wherein said controllable source of pressure further comprises a source of inert gas.

* * * * *